(12) United States Patent
Park et al.

(10) Patent No.: US 10,418,105 B2
(45) Date of Patent: Sep. 17, 2019

(54) SEMICONDUCTOR MEMORY DEVICE

(71) Applicant: SK hynix Inc., Gyeonggi-do (KR)

(72) Inventors: Sun Kyu Park, Chungcheongbuk-do (KR); Min Kyu Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/620,886

(22) Filed: Jun. 13, 2017

(65) Prior Publication Data

US 2018/0082744 A1 Mar. 22, 2018

(30) Foreign Application Priority Data

Sep. 20, 2016 (KR) .................. 10-2016-0120066

(51) Int. Cl.
| | |
|---|---|
| *G11C 16/04* | (2006.01) |
| *G11C 16/08* | (2006.01) |
| *G11C 8/12* | (2006.01) |
| *G11C 8/14* | (2006.01) |
| *H01L 27/11524* | (2017.01) |

(52) U.S. Cl.
CPC .............. *G11C 16/08* (2013.01); *G11C 8/12* (2013.01); *G11C 8/14* (2013.01); *G11C 16/0483* (2013.01); *H01L 27/11524* (2013.01)

(58) Field of Classification Search
CPC ............ G11C 13/0069; G11C 2213/71; G11C 16/0483; G11C 13/00; G11C 13/004; G11C 2013/0054; G11C 2013/009; G11C 2213/72; G11C 8/12; G11C 13/0023; G11C 13/003; G11C 16/08; G11C 2213/73; G11C 2213/77
USPC .... 365/148, 185.11, 185.18, 189.05, 189.07, 365/230.03, 163, 189.16, 230.06, 233.1, 365/51, 63, 149, 17, 185.13, 185.14
See application file for complete search history.

(56) References Cited

U.S. PATENT DOCUMENTS

| | | | |
|---|---|---|---|
| 6,714,478 B2* | 3/2004 | Tomita | G11C 8/14 365/154 |
| 2007/0019474 A1* | 1/2007 | Kim | G11C 16/10 365/185.18 |
| 2014/0064012 A1* | 3/2014 | Shin | G11C 8/12 365/230.03 |
| 2017/0330886 A1* | 11/2017 | Lee | H01L 27/11286 |
| 2017/0372786 A1* | 12/2017 | Lee | G11C 16/16 |

FOREIGN PATENT DOCUMENTS

| | | |
|---|---|---|
| KR | 1020030019042 | 3/2003 |
| KR | 1020090080337 | 7/2009 |
| KR | 1020110072703 | 6/2011 |
| KR | 1020110093088 | 8/2011 |

* cited by examiner

*Primary Examiner* — Thong Q Le
(74) *Attorney, Agent, or Firm* — IP & T Group LLP

(57) ABSTRACT

Disclosed is a semiconductor memory device. The semiconductor memory device includes: a first memory block; and a second memory block sharing a block word line with the first memory block, in which the block word line includes a first block word line disposed so as to overlap the first memory block and a second block word line disposed so as to overlap the second memory block. According to the present disclosure, it is less likely to have an operation failure.

19 Claims, 6 Drawing Sheets

SEMICONDUCTOR MEMORY DEVICE

CROSS-REFERENCE TO RELATED APPLICATION

The present application claims priority under 35 U.S.C. § 119(a), to Korean patent application number 10-2016-0120066, filed on Sep. 20, 2016, the entire disclosure of which is incorporated herein by reference in its entirety.

BACKGROUND

Field of Invention

The present disclosure relates generally to a semiconductor memory device and a method of manufacturing the same and, more particularly, to a more reliable semiconductor memory device less prone to operation failure, and a method of manufacturing the same.

Description of the Related Art

Typically, a semiconductor memory device may include a cell array area which includes a plurality of memory cells for storing data in the form of stored charges, and a peripheral area which includes a plurality of operation circuit groups for performing various operations including program, read and erase operations on the memory cells.

Typically, the memory cells may be divided into a plurality of memory blocks. Also, the operation circuit groups may include a block decoder, which outputs a block selection signal for selecting any one of the memory blocks, and a switching group, which transmits operation voltages applied through global lines to the selected memory block in response to the block selection signal. The block selection signal from a row decoder may be applied to the switching group through a block word line.

During operation of conventional semiconductor memory devices it has been observed that a block word line may be disconnected resulting in an operation failure of the semiconductor memory device.

SUMMARY

The present disclosure provides an improved semiconductor device that addresses the above-described problems associated with the prior art. The present disclosure provides an improved semiconductor memory device which is less likely to have an operation failure, and a method of manufacturing the same.

Other objects of the present invention will become apparent to those skilled in the art to which the present invention pertains through the exemplary embodiments of the present invention which are described below.

An exemplary embodiment of the present disclosure provides a semiconductor memory device, including: a first memory block; and a second memory block sharing a block word line with the first memory block, in which the block word line includes a first block word line disposed so as to overlap the first memory block and a second block word line disposed so as to overlap the second memory block.

The first memory block may include a first source select line, a first drain select line, and a first word line group formed of a plurality of first word lines disposed between the first source select line and the first drain select line, and wherein the first block word line may be disposed so as to overlap the first word line group between the first source select line and the first drain select line.

The second memory block may include a second source select line, a second drain select line, and a second word line group formed of a plurality of second word lines disposed between the second source select line and the second drain select line, and wherein the second block word line may be disposed so as to overlap the second word line group between the second source select line and the second drain select line.

The first and second block word lines may transfer a block selection signal for selecting the second memory block.

The block word line may further include a third block word line for transferring the block selection signal for selecting the first memory block.

Another exemplary embodiment of the present disclosure provides a semiconductor memory device, including: a memory array including a first memory block and a second memory block; a first switching group configured to transfer first operation voltages to the first memory block in response to a block selection signal; a second switching group facing the first switching group with the memory array interposed therebetween, and configured to transmit second operation voltages to the second memory block in response to the block selection signal; and two or more block word lines overlapping the memory array, spaced apart from each other on the memory array, commonly connected to the second switching group, and configured to transfer the block selection signal to the second switching group.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION OF THE INVENTION

Figure 1:
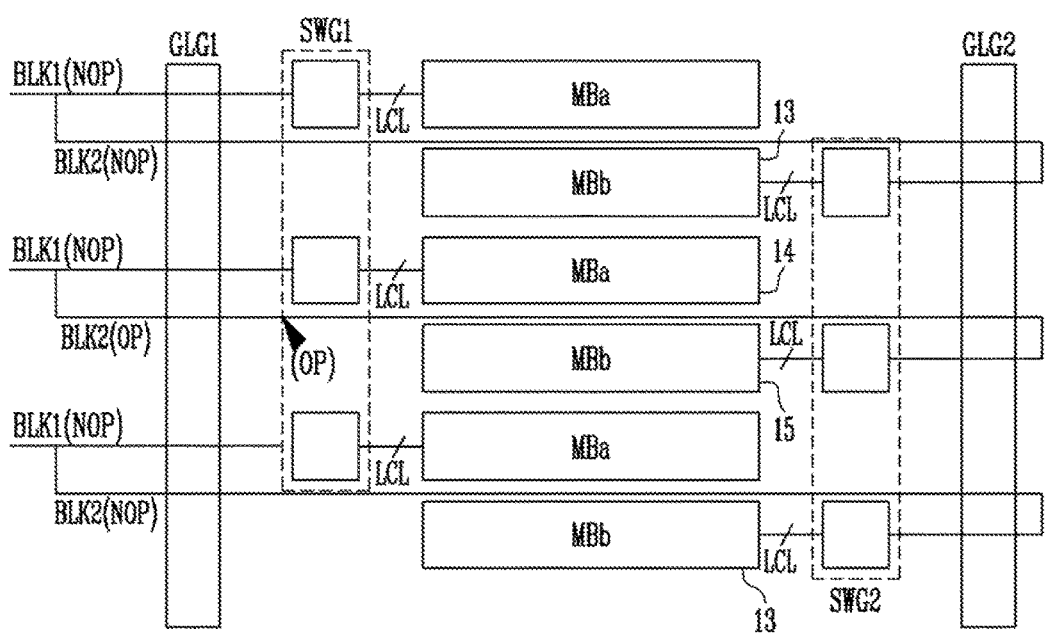
FIG. 1 is a diagram illustrating a shared block structure applied to a semiconductor memory device.

Various embodiments will now be described more fully as examples of the present invention with reference to the accompanying drawings; however, it is noted the present invention may be embodied in different other embodiments and variations thereof and should not be construed as limited only to the embodiments set forth herein. Rather, these embodiments are provided as illustrative examples so that this disclosure will be thorough and complete, and will fully convey the present invention to those skilled in the art.

We note, that the drawings are simplified illustrations of specific embodiments. Moreover, in the drawings, various dimensions may be exaggerated for clarity of illustration. It will be further understood that when an element is referred to as being between two elements, it can be the only element between the two elements, or one or more intervening elements may also be present. Like reference numerals may refer to like elements throughout the various drawings.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

In the following description numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a diagram illustrating a shared block structure of a semiconductor memory device.

Referring to FIG. 1, a semiconductor memory device includes a memory array, a first switching group SWG1, a second switching group SWG2, a first global line group GLG1, and a second global line group GLG2.

The memory array includes a plurality of first and second memory blocks MBa and MBb, which are alternately disposed in one direction.

The first switching group SWG1 includes a plurality of switching elements for transferring operation voltages provided through the first global line group GLG1 to the first memory blocks MBa. The second switching group SWG2 includes a plurality of switching elements for transferring operation voltages provided through the second global line group GLG2 to the second memory blocks MBb. The first switching group SWG1 and the second switching group SWG2 are operated in response to block selection signals provided to first and second block word lines BLK1 and BLK2. The first switching group SWG1 and the second switching group SWG2 transfer the operation voltages to local lines LCL extended from the plurality of memory blocks MBa and MBb. A first plurality of local lines LCL are connected to the first switching group SWG1 and a second plurality of local lines LCL are connected to the second switching group SWG2. The local lines LCL to each memory block may include a source select line, a drain select line, and a plurality of word lines.

The shared block structure further includes a first block word line BLK1 and a second block word line BLK2, which are connected to each other so that a pair of adjacent first memory blocks MBa and second memory block MBb may be controlled by the same block selection signal. The first block word line BLK1 transfers a block selection signal to the first switching group SWG1 connected to the first memory block MBa, and the second block word line BLK2 transfers a block selection signal to the second switching group SWG2 connected to the second memory block MBb. As illustrated in FIG. 1, the memory array may be disposed between the first switching group SWG1 and the second switching group SWG2. Also, a distance between the second block word line BLK2 and the second switching group SWG2 is larger than a distance between the first, block word line BLK1 and the first switching, group SWG1. Accordingly, the second block word line BLK2 may be formed to be longer than the first block word line BLK1. Hence, in such configuration, there is a high possibility in that the second block word line BLK2 is disconnected.

A memory block of the disconnected block word line OP is processed as a bad block 15 in a test for screening a failure of the semiconductor memory device. Memory blocks of normal block word lines NOP may be normally operated. The normally operated memory blocks may include a seed block 14 and victim blocks 13. The seed block 14 is a memory block controlled by the same block selection signal as the bad block 15, and the victim blocks 13 are memory blocks controlled by the same global line group as the bad block 15.

During the operation of the seed block 14, the bad block 15 may be floated. The floating state of the bad block 15 may be maintained until an initial stage of a program operation of the victim blocks 13. During the program operation, a program pulse application operation and a verification operation may be repeated within the threshold number of times. After the operation of the seed block 14, during the floating state of the bad block 15, even though the victim blocks 13 are normally programmed, a program pulse may be unnecessary repeatedly applied. As described above, the bad block 15 may influence an operation of the normal memory blocks, which do not have structural defects.

A memory device according to an exemplary embodiment of the present disclosure may decrease the generation of the bad block by dualizing or diversifying the second block word line BLK2, of which a disconnection defect is easily generated. The operation failure may be prevented by screening the shared normal memory block (e.g., the first memory block MBa 14) of the bad block (e.g., the second memory block MBb 15 of the disconnected second block word line BLK2) as well as screening the bad block itself, which causes an increase in the number of memory blocks which are processed as bad blocks and thus may increase yield loss. In accordance with an embodiment of the present disclosure, the memory device is advantageous in decreasing yield loss.

The dualized or diversified second block word line BLK2 may decrease electric resistance of the second block word line BLK2, and thus it is possible to solve a program speed difference essentially accompanying between the first and second memory blocks MBa and MBb.

Figure 2:
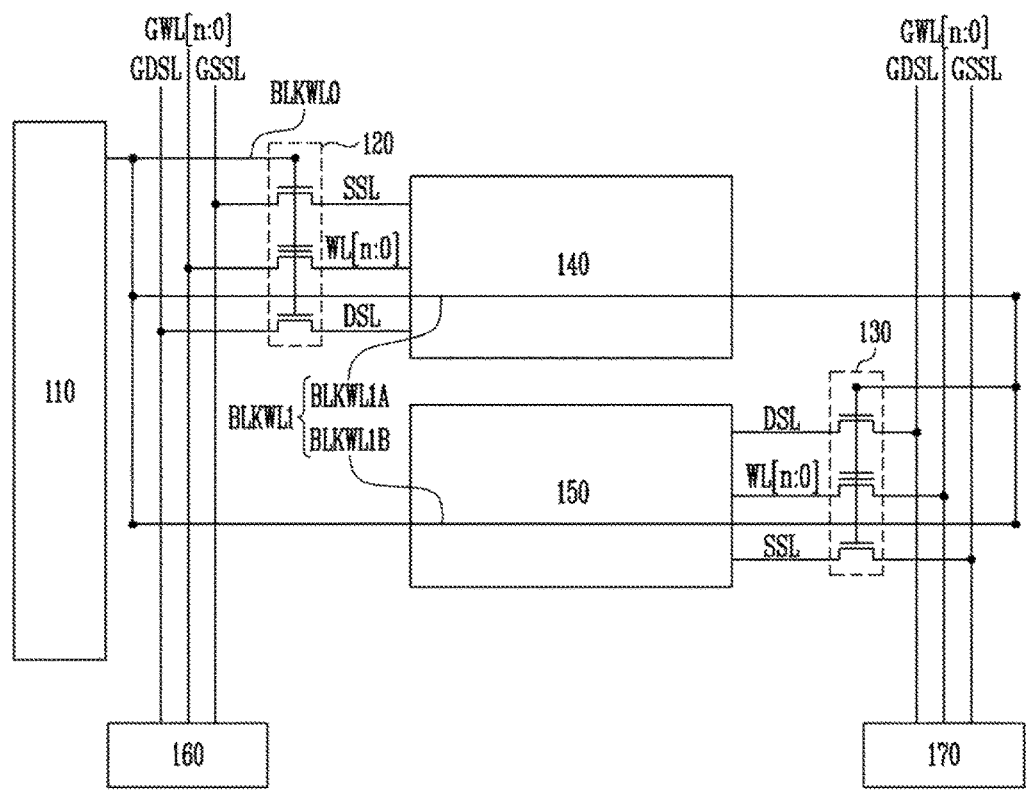
FIG. 2 is a diagram illustrating a semiconductor memory device having a dualized block word line structure, according to an exemplary embodiment of the present disclosure.

FIG. 2 is a diagram illustrating a semiconductor memory device having a dualized block word line structure, according to an exemplary embodiment of the present disclosure.

Referring to FIG. 2, the semiconductor memory device includes a plurality of memory blocks 140 and 150, and operation circuit groups 110, 120, 130, 160, and 170. In the present disclosure, for convenience of the description, only the two memory blocks and the operation circuit groups for the same are illustrated, but the present disclosure is not limited thereto.

Each of the memory blocks 140 and 150 may be coupled to a source select line SSL, a drain select line DSL, and a word line group WL[n:0] formed between the source select line SSL and the drain select line DSL. The word line group WL[n:0] includes a plurality of word lines.

The drain select transistors connected to the drain select line DSL, source select transistors connected to the source select line SSL, and memory cells connected to each of the word lines of the word line group WL[n:0].

Figure 3:
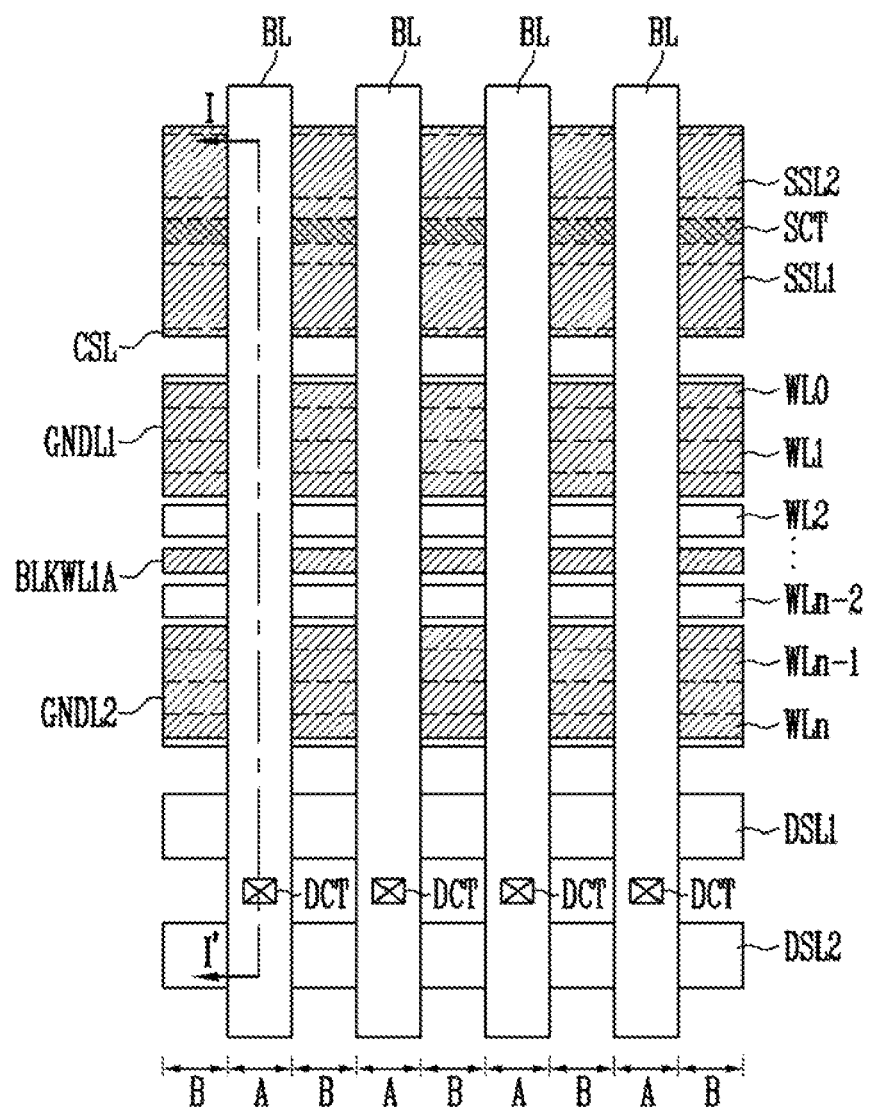
FIG. 3 is a top plan view of a first memory block, according to an exemplary embodiment of the present disclosure.

The memory blocks 140 and 150 further include bit lines BL formed in a direction crossing the source select line SSL, the drain select line DSL and the word line group WL[n:0] (see FIG. 3).

The memory blocks 140 and 150 according to the exemplary embodiment of FIG. 2 are connected to each other through block word lines BLKWL0, BLKWL1A, and BLKWL1B, which will be described below in detail.

The operation circuit groups 110, 120, 130, 160, and 170 include a block decoder 110, global line decoders 160 and 170, and switching groups 120 and 130.

The block decoder 110 outputs to the block word lines BLKWL0, BLKWL1A, and BLKWL1B a block selection signal for selecting the memory blocks 140 and 150 in response to row address signals.

Further, the global line decoders 160 and 170 output to global line groups GSSL, GWL[n:0] and GDSL operation voltages for programming, reading, or erasing the memory cells.

The switching groups 120 and 130 connect the global line groups GSSL, GWL[n:0] and GDSL to the selected memory block in response to the block selection signal.

The switching groups 120 and 130 include a first switching group 120 disposed between the block decoder 110 and the first memory block 140, and a second switching group 130 disposed beside the second memory block 150 such that the second memory block 150 is disposed between the second switching group 130 and the block decoder 110.

The global lines groups GSSL, GWL[n:0], and GDSL transfer operation voltages for programming, reading, or erasing the memory cells. The global line groups GSSL, GWL[n:0] and GDSL include a first global line group which transfers operation voltages to the first switching group 120, and a second global line group, which transfers operation voltages to the second switching group 130.

The first switching group 120 includes pass transistors configured to connect the first global line groups to the first memory block 140 in response to a first block selection signal.

The second switching group 130 includes pass transistors configured to connect the second global line groups to the second memory block 150 in response to a second block selection signal.

The global line decoders 160 and 170 include a first global line decoder 160, which outputs operation voltages to the first switching group 120 through the first global line group, and a second global line decoder 170, which outputs operation voltages to the second switching group 130 through the second global line group.

The first memory block 140 and the second memory block 150 may be adjacently disposed. The first switching group 120 and the second switching group 130 may be disposed while facing each other with the first memory block 140 and the second memory block 150 interposed therebetween. The block decoder 110 may be adjacently disposed to the first switching group 120. That is, the block decoder 110 may be closer to the first switching group 120 than the second switching group 130.

The block selection signals output from the block decoder 110 are transferred to the first and second switch groups 120 and 130 through block word line groups. For example, a first block selection signal output from the block decoder 110 is transferred to the first and second switch groups 120 and 130 through the first block word line group. Each of the block word line groups includes three or more divided block word lines BLKWL0, BLKWL1A, BLKWL1B. For example, the first block word line group includes a first block word line BLKWL0, which transfers the first block selection signal output from the block decoder 110 to the first switching group 130, and a plurality of second block word lines BLKWL1A and BLKWL1B, which transfer the first block selection signal to the second switching group 130.

Although not illustrated in FIG. 2, a second blow selection signal for another first and second memory blocks and output from the bock decoder 110 may be transferred to another first and second switch groups through a second block word line group, and the second block word line group may include a first block word line, which transfers the second block selection signal output from the block decoder 110 to another first switching group, and a plurality of second block word lines, which transfer the second block selection signal to another second switching group.

The first block word line BLKWL0 couples the block decoder 110 and the first switching group 120.

The plurality of second block word lines BLKWL1A and BLKWL1B pass through the memory array area, which includes the first and second memory blocks 140 and 150, to couple the block decoder 110 and the second switching group 130 since the memory array area is disposed between the first and second switching groups 120 and 130. The first and second block woad lines BLKWL0, BLKWL1A and BLKWL1B may be connected to one another outside the memory array area, which the first and second memory blocks 140 and 150 are formed.

The semiconductor memory device, according to an exemplary embodiment of the present disclosure, has a shared block structure wherein the adjacent memory blocks 140 and 150 are controlled by the same block selection signal through the interconnected block word lines BLKWL0, BLKWL1A, and BLKWL1B. That is, in response to a single block selection signal transferred through the block word lines BLKWL0, BLKWL1A, and BLKWL1B, the first witching group 120 may transfer the first operation voltages to the first memory block 140 and the second switching group 130 may transfer the second operation voltages to the second memory block 150.

The shared block structure has some of the block word lines passing through the memory array area, in which the memory blocks are formed. In FIG. 2 the second block word lines BLKWL1A and BLKWL1B among the BLKWL0, BLKWL1A and BLKWL1B are disposed to pass through the memory array area, in which the first memory block 140 and the second memory block 150 are formed. One block word line BLKWL1A between the second block word lines BLKWL1A and BLKWL1B is disposed so as to pass through the first memory block 140, and the other block word line BLKWL1B is disposed to pass through the second memory block 150.

The first block word line BLKWL0 is formed of one single line, however, the second block word line BLKWL1 is formed of two lines BLKWL1A and BLKWL1B. In the shared block structure according to the exemplary embodiment of the present disclosure, the second block word line BLKWL1 passing through the memory blocks 140 and 150 are two physically different lines, so that even though one of the two second block word lines BLKWL1A and BLKWL1B is disconnected, it is possible to perform a normal operation with remaining line. Accordingly, in an exemplary embodiment of the present disclosure, an improved shared block structure is provided which minimizes the likelihood of a disconnection failure. Various curve structures may be introduced in: order to improve performance (for example, a decrease in capacitance during an erase operation) of the memory device.

Hereinafter, a detailed structure of the memory block for dualizing the block word line will be described with reference to FIGS. 3 to 5.

Figure 4:
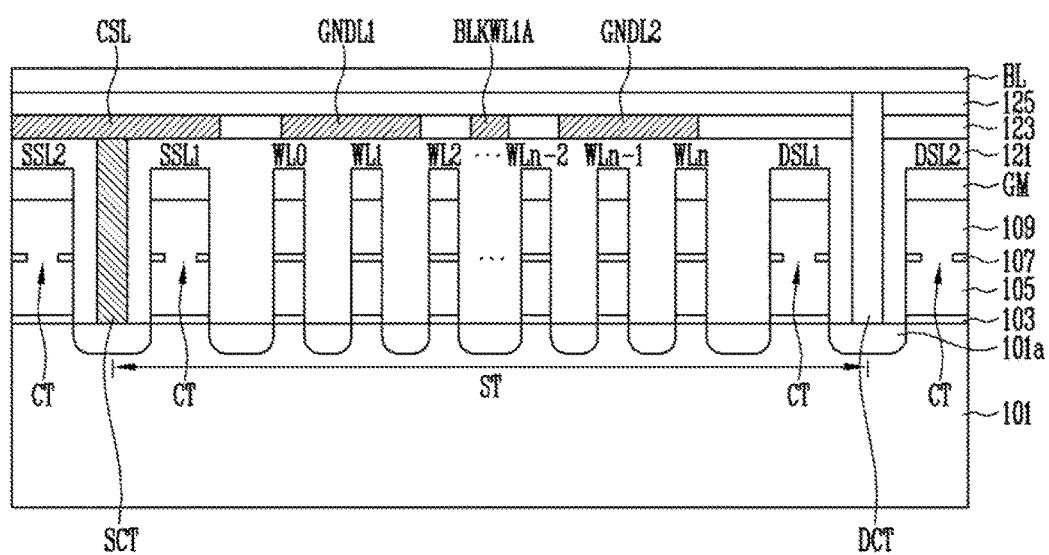
FIG. 4 is a cross-sectional view taken along line of FIG. 3.

FIG. 3 is a top plan view of a first memory block according to an exemplary embodiment of the present disclosure FIG. 4 is cross-sectional view taken along line I-I' of FIG. 3. FIG. 5 is a top plan view of memory blocks illustrating a second memory block adjacent to the first memory block illustrated in FIG. 3.

Figure 5:
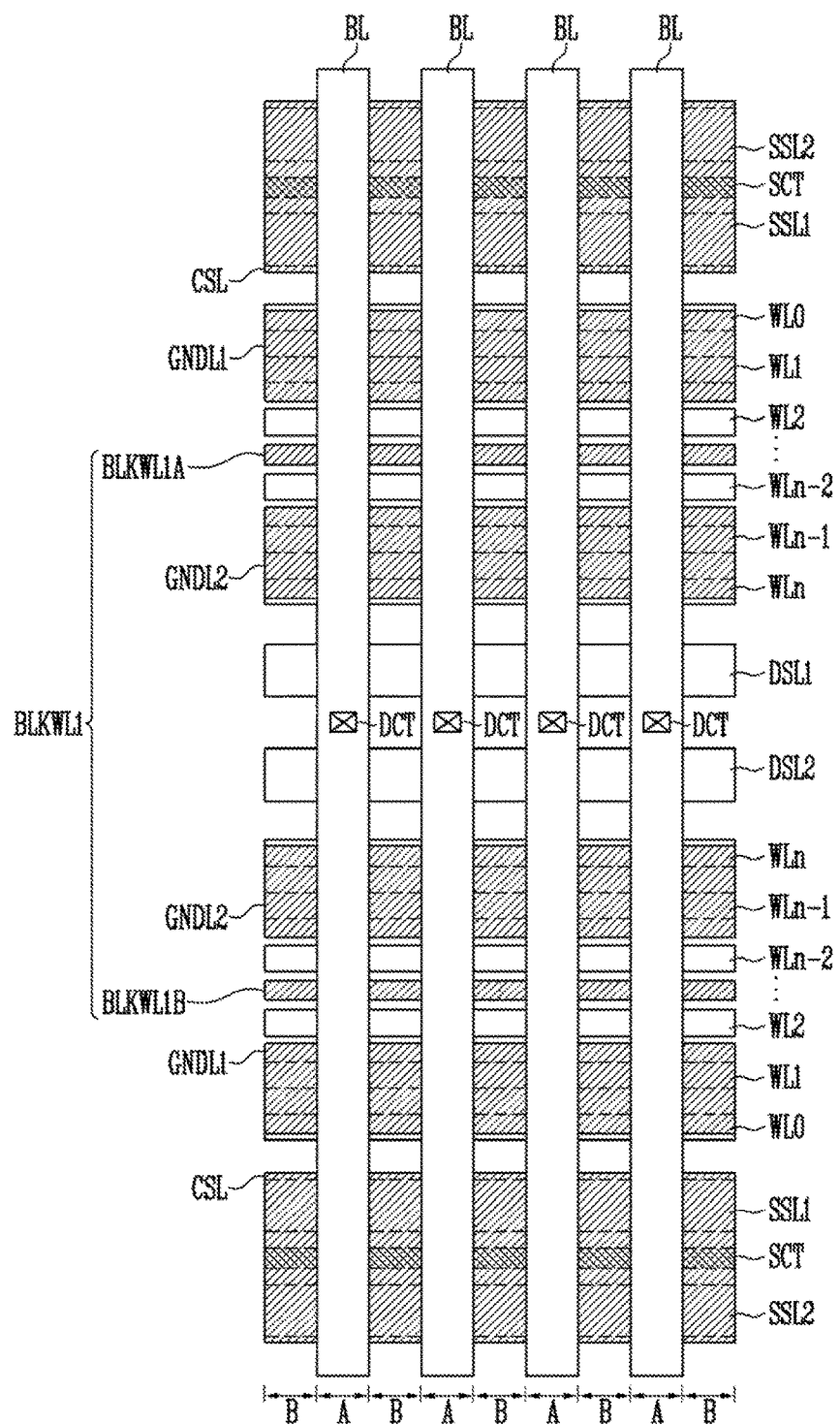
FIG. 5 is a top, plan view of memory blocks illustrating a first memory block and a second memory block adjacent to the first memory block illustrated in FIG. 3.

Referring to FIGS. 3 to 5, the first memory block of the semiconductor device is formed on a semiconductor substrate 101, in which alternately disposed active areas A and device isolating areas B are defined. The active areas A and the device isolating areas B extend in a first direction. The first direction may be a direction substantially perpendicular to the substrate 101. The active areas A are areas divided by a device isolating trench and a device isolating layer formed in the device isolating area B.

The first memory block includes a first source select line SSL1, a first drain select line DSL1, and a first word line group, all of which are extended in a second direction crossing the active areas A and the device isolating areas B. The second direction may be substantially perpendicular to the first direction. The first word line group includes a plurality of first word lines WL0 to WLn, which is disposed between the first source select line SSL1 and the first drain select line DLS1. Although not illustrated in the drawing, the first memory block may further include a first dummy word line formed between the first source select line SSL1 and the first word line group, and a second dummy wordline formed between the first drain select line DSL1 and the first word line group.

Source select transistors are formed at crossing portions of the first source select line SSL1 and the active areas A, drain select transistors are formed crossing portions of the first drain select line DSL1 and the active areas A, and the memory cells are formed at in crossing portions of the first word lines WL0 to WLn and the active areas A. Junction areas 101a, in which impurities are injected, are formed inside the semiconductor substrate 101. The source select transistor, the drain select transistor, and the memory cell transistors formed on each of the active areas A are serially connected by the junction areas 101a to form a string structure ST.

The first source select line SSL1 may be adjacently disposed to a second source select line SSL2 of the second memory block, and the first drain select line DSL1 may be adjacently disposed to a second dram select line DSL2 of another second memory block. The second memory blocks may be disposed with the first memory block interposed therebetween. Each of the second memory blocks includes the second source select line SSL2, the second drain select line DSL2, and a second word line group disposed between the second source select line SSL2 and the second drain select line DSL2. The second word line group includes a plurality of second word lines.

Each of the junction areas 101a between the first and second source select lines SSL1 and SSL2 is defined as a source area of the string structure ST, and each of the junction areas 101a between the first and second drain select lines DSL1 and DSL2 is defined as a drain area of the string structure ST.

The source select lines SSL, the drain select lines DSL, the first word lines WL0 to WLn, and the junction areas 101a are covered by at least one first interlayer insulating layer 121. The first interlayer insulating layer 121 may be formed of a low k dielectric layer having a lower dielectric constant than that of a silicon oxide layer in order to decrease an interference between the second block word lines BLKWL1A formed over a top surface of the first interlayer insulating layer 121 and the first word line group formed below a lower surface of the first interlayer insulating layer 121, and an interference between grounds lines GNDL1 and GNDL2 formed over the top surface of the first interlayer insulating layer 121 and the first word line groups formed below the lower surface of the first interlayer insulating layer 121.

The first interlayer insulating layer 121 between the first and second source select lines SSL1 and SSL2 is passed through by a source contact line SCT. The source contact line SCT may be extended in the same direction as an extension direction of the first and second source select lines SSL1 and SSL2, and may be commonly connected to the junction areas 101a between the first and second source select lines SSL1 and SSL2.

The first interlayer insulating layer 121 between the first and second drain select lines DSL1 and DSL2 is passed through by drain contact plugs DCT. The drain contact plugs DCT are connected to the junction areas 101a within the active areas A disposed between the first and second drain select lines DSL1 and DSL2. The drain contact plugs DCT may protrude from an upper portion of the first interlayer insulating layer 121 and further pass through second and third interlayer insulating layers 123 and 125 formed between the first interlayer insulating layer 121 and the bit line BL.

The second interlayer insulating layer 123 is formed on the first interlayer insulating layer 121. The second interlayer insulating, layer 123 may be passed through by a common source line CSL, ground lines GNDL1 and GNDL2, and the second block word line BLKWL1A.

The common source line CSL may pass through the second interlayer insulating layer 123 on the source contact line SCT and formed with a larger width than that of the source contact line SCT. For example, the common source line CSL may be formed with a width completely overlapping the first and second source select lines SSL1 and SSL2.

Each of the ground lines GNDL1 and GNDL2 may be formed while passing through the second interlayer insulating layer 123 on the first word lines WL0 to WLn. Each of the grounds lines GNDL1 and GNDL2 may be formed with a width corresponding to the common source line CSL. The ground lines GNDL1 and GNDL2 may be extended so as to be connected to some devices configuring an operation circuit group. For example, the ground lines GNDL1 and GNDL2 may be extended so as to be connected to a discharge transistor (not illustrated) configuring the operation circuit group.

The second block word line BLKWL1A may be formed while passing through the second interlayer insulating layer 123 on the first word lines WL0 to WLn. The second block word line BLKWL1A may be formed with a smaller width than that of the common source line CSL. The second block word line BLKWL1A is one of the dualized second block word lines BLKWL1. The second block word line BLKWL1A may be disposed between the ground lines GNDL1 and GNDL2.

The common source line CSL according to the exemplary embodiment of the present disclosure may be formed in a non-mesh type. The non-mesh-typed common source line CSL does not overlap the first word lines WL0 to WLn, the ground lines GNDL1 and GNDL2, the second block word line BLKWL1A, and the first drain select line DSL1.

The non-mesh-typed common source line CSL decreases a region occupied thereby, and thus it is possible to secure a space in which one second block word line BLKWL1A between the dualized second block word lines is disposed.

The ground lines GNDL1 and GNDL2 according to the exemplary embodiment of the present disclosure are disposed on the same layer as that of the common source line CSL and the second block word line BLKWL1A, and decrease interference between the common source line CSL and the second block word line BLKWL1A. As illustrated in FIGS. 3 and 4, the ground lines GNDL1 and GNDL2 may include a first ground line GNDL1 disposed between the common source line CSL and the second block word line BLKWL1A, and a second ground line GNDL2 disposed between the second block word line BLKWL1A and the drain contact plugs DCT.

The second block word line BLKWL1B that is the other of the dualized second block word lines BLKWL1 is illustrated in FIG. 5. Referring to FIG. 5, the diversified second block word lines BLKWL1A and BLKWL1B pass through the upper portions of the adjacent first memory block and second memory block. The diversified second block word lines BLKWL1A and BLKWL1B may be connected to each other so as to transfer the same block selection signal. A connection structure of the diversified second block word lines BLKWL1A and BLKWL1B is described with reference to FIG. 2. One BLKWL1A of the diversified second block word lines BLKWL1A and BLKWL1B is disposed so as to overlap a region, in which the first word lines WL0 to WLn of the first memory block are formed, and the other BLKWL1B is disposed so as to overlap a region, in which the second word lines WL0 to WLn of the second memory block are formed. That is one BLKWL1A of the diversified second block word lines BLKWL1A and BLKWL1B may be formed so as to pass through the upper portions of the first word lines WL0 to WLn of the first memory block, and the other BLKWL1B may be formed so as to pass through the upper portions of the second word lines WL0 to WLn of the second memory block. Each of the diversified second block word lines BLKWL1A and BLKWL1B is disposed in a region, in which a mesh pattern of the common source line CSL of the corresponding memory block is removed.

According to the exemplary embodiment of the present disclosure, it is possible to prevent an operation failure caused by a disconnection defect of a block word line. Further, according to the exemplary embodiment of the present disclosure, it is possible to decrease electric resistance of the block word line. Further, according to the exemplary embodiment of the present disclosure, it is possible to solve a program speed difference between adjacent memory blocks.

A method of manufacturing the semiconductor memory device according to an exemplary embodiment of the present disclosure will be described with reference to FIGS. 3 to 5.

A device isolating layer formed in the device isolating regions B, and the semiconductor substrate 101 including a tunnel insulating layer 103 and a first conductive layer 105 for a floating gate, which are laminated on the active areas A divided by the device isolating layer, is formed.

Then, a dielectric layer 107 is formed along a surface of an entire structure, in which the first conductive layer 105 is formed, and a contact hole CT is formed by etching the dielectric layer 107 in a region, in which the first and second source select lines SSL1 and SSL2 and the first and second drain select lines DSL1 and DSL2 are to be formed.

Next, a second conductive layer 109 for a control gate is formed on an entire structure, in which the contact hole CT is formed, and gate mask patterns GM are formed on the second conductive layer 109.

Then, the second conductive layer 109, the dielectric layer 107, and the first conductive layer 105 are etched by using the gate mask patterns GM as an etching barrier. In this case, the tunnel insulating layer 103 may be further etched. The first and second source select lines SSL1 and SSL2, the first and second drain select lines DSL1 and DSL2, and the first word lines WL0 to WLn are formed through an etching process using the gate mask patterns GM as the etching barrier.

Then, the junction areas 101a are formed by injecting impurities to the active areas A between the first and second select lines SSL1 and SSL2, the first and second drain select lines DSL1 and DSL2, and the first word lines WL0 to WLn.

The first interlayer insulating layer 121 is formed on an entire structure in which the junction areas 101a are formed. In this case, the first interlayer insulating layer 121 may be formed of a low-k dielectric layer. Accordingly, even though a thickness of the first interlayer insulating layer 121 is not increased, it is possible to minimize parasitic capacitance between the second block word line BLKWL1A, which is to be formed on the first interlayer insulating layer 121, and the first word line group formed under the first interlayer insulating layer 121.

After the first interlayer insulating layer 121 is formed the source contact line SCT may be formed by forming a source contact trench by etching the first interlayer insulating layer 121 between the first and second source select lines SSL1 and SSL2, and filling the source contact trench with a conductive material.

Subsequently, the second interlayer insulating layer 123 is formed on an entire structure in which the source contact line SCT is formed.

Then, a common source line trench, ground lines trenches, and a block word line trench are formed by etching the second interlayer insulating layer 123. More particularly, the common source line trench is disposed so as to overlap a region covering the first and second source select lines SSL1 and SSL2. The common source line trench is disposed so as not to overlap the first word lines WL0 to WLn and the first drain select line DSL1. The ground line trenches are disposed so as to overlap the first word lines WL0 to WLn. The block word line trenches are disposed so as to overlap the first word lines WL0 to WLn. The block word line trench may be disposed between the ground line trenches.

Next, the common source line CSL, the ground lines GNDL1 and GNDL2, and the second block word lines BLKWL1A and BLKWL1B are formed by filling the common source line trench, the ground line trenches, and the block word line trench with a conductive material.

The third interlayer insulating layer 125 is formed on an entire structure, in which the common source line CSL, the ground lines GNDL1 and GNDL2, and the second block word lines BLKWL1A and BLKWL1B are formed.

Then, drain contact holes, which pass through from the third interlayer insulating layer 125 to the first interlayer insulating layer 123 between the first and second drain select lines DLS1 and DSL2 and open the junction areas 101a, are formed.

Next, the drain contact plugs DCT are formed by filling the drain contact holes with a conductive material.

Then, the bit lines BL connected to the drain contact plugs DCT are formed on the third interlayer insulating layer 125.

Figure 6:
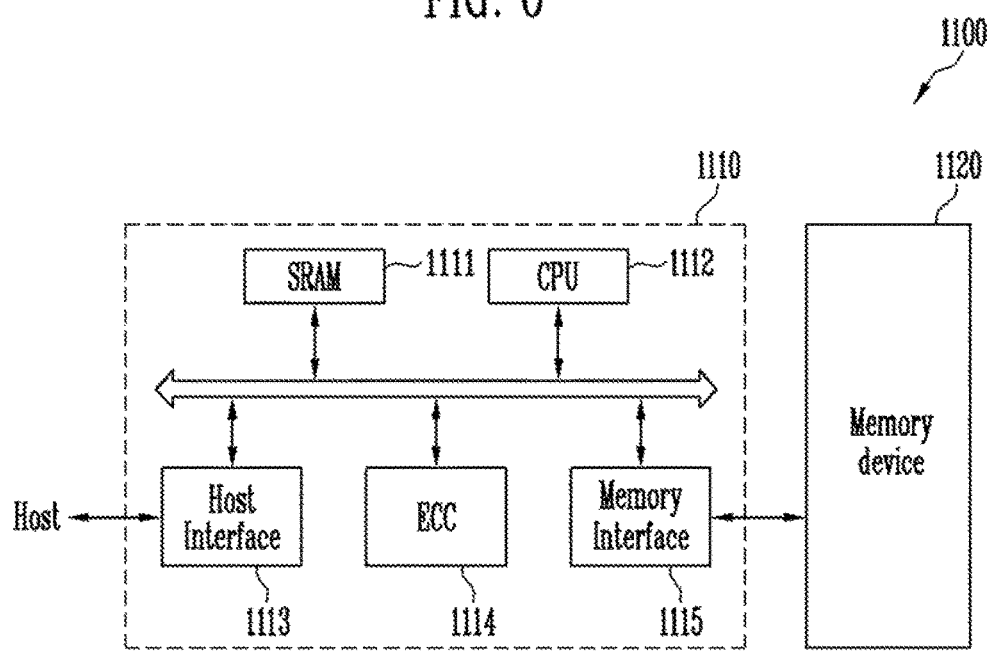
FIG. 6 is a block diagram illustrating a configuration of a memory system, according to an exemplary embodiment of the present disclosure.

FIG. 6 is a block diagram illustrating a configuration of a memory system, according to an exemplary embodiment of the present disclosure.

Referring to FIG. 6, a memory system 1100 according to an exemplary embodiment of the present disclosure includes a memory device 1120 and a memory controller 1110.

The memory device 1120 may have the structure described with reference to FIGS. 2 to 5. For example, the memory device 1120 may have a structure, in which adjacent memory blocks are connected to each other through a block word line. In this case, the block word line, which is disposed to pass through a region, in which the memory blocks are formed, may be dualized into two block word lines and may be disposed to overlap a region, in which word lines are formed, together with ground lines connected to a ground of an adjacent metal wire. Further, the memory device 1120 may be a multi-chip package formed of a plurality of flash memory chips.

The memory controller 1110 may be configured to control the memory device 1120, and may include a Static Random Access Memory (SRAM) 1111, a Central Processing Unit (CPU) 1112, a host interface 1113, an Error Correction Code (ECC) 1114, and a memory interface 1115. The SRAM 1111 is used as an operational memory of a CPU 1112, the CPU 1112 performs a general control operation for a data exchange of the memory controller 1110, and a host interface 1113 includes a data exchange protocol of a host connected with the memory system 1100. Further, the ECC 1114 detects and corrects an error included in data read from the memory device 1120, and the memory interface 1115 performs interfacing with the memory device 1120. In addition, the memory controller 1110 may further include a Read Only Memory (ROM) and the like for storing code data for interfacing with the host.

The memory system 1100 may be a memory card or a Solid State Disk (SSD) in which the memory device 1120 is combined with the memory controller 1110. For example, when the memory system 1100 is an SSD, the memory controller 1110 may communicate with an external device (for example, the host) through one of various interface protocols, such as Universal Serial Bus (USB), MultiMedia Card (MMC), Peripheral Component Interconnection-Express (PCI-E), Serial Advanced Technology Attachment (SATA), Parallel Advanced Technology Attachment (DATA), Small Computer Small Interface (SCSI), Enhanced Small Disk Interface (ESDI), and Integrated Drive Electronics IDE).

Figure 7:
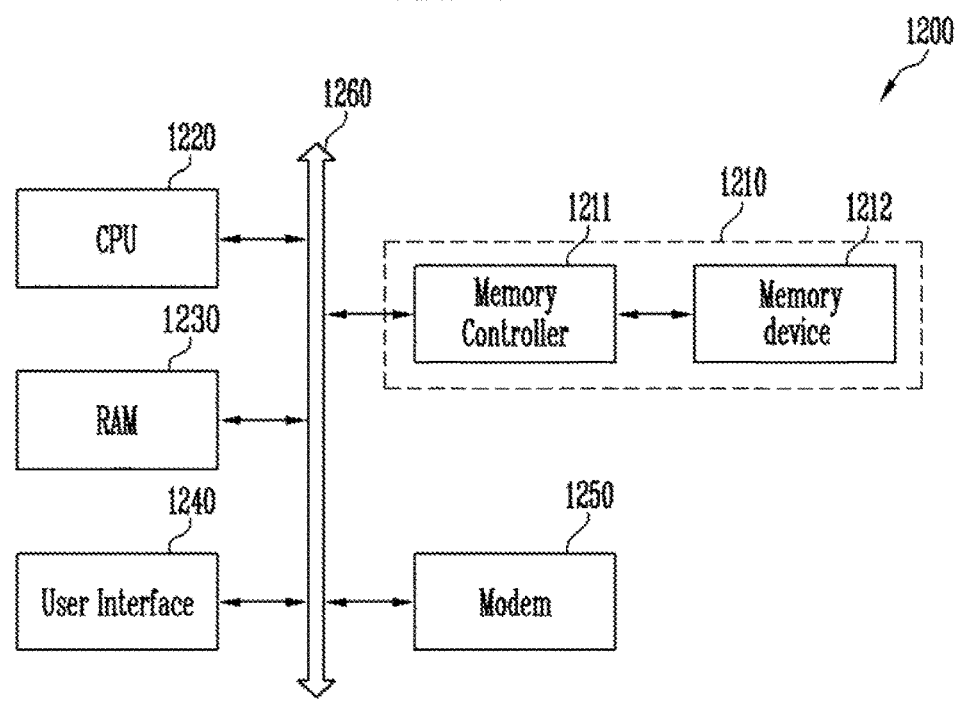
FIG. 7 is a block diagram illustrating e configuration of a computing system, according to an exemplary embodiment of the present disclosure.

FIG. 7 is a block diagram illustrating a configuration of a computing system, according to an exemplary embodiment of the present disclosure.

Referring to FIG. 7, a computing system 1200 according to an embodiment of the present disclosure may include a CPU 1220, a Random Access Memory (RAM) 1230, a user interface 1240, a modem 1250, and a memory system 1210, which are electrically connected to a system bus 1260. Further, in a case where the computing system 1200 is a mobile device, the computing system 1200 may further include a battery for supplying an operational voltage to the computing system 1200, and may further include an application chip-set, a camera Image processor (CIS), a mobile DRAM, and the like.

The memory system 1210 may be formed of a memory device 1212 and a memory controller 1211 as previously described with reference to FIG. 6.

The technical spirit of the present disclosure has been described, according to exemplary embodiments in detail, however, it is noted that the exemplary embodiments described herein for purposes of illustration do not limit the scope of the present disclosure. Those skilled in the art will appreciate that various other embodiments and variations thereof may be made within the scope of the present disclosure.

What is claimed is:

1. A semiconductor memory device, comprising:
a first memory block; and
a second memory block; and
a block word line which overlaps the first memory block and the second memory block,
wherein the block word line includes a first block word line disposed so as to overlap the first memory block and a second block word line disposed so as to overlap the second memory block, and
wherein the first and second block word lines transfer a block selection signal for selecting the second memory block.

2. The semiconductor memory device of claim 1,
wherein the first memory block includes a first source select line, a first drain select line, and a first word line group formed of a plurality of first word lines disposed between the first source select line and the first drain select line, and
wherein the first block word line is disposed so as to overlap the first word line group between the first source select line and the first drain select line.

3. The semiconductor memory device of claim 2,
wherein the second memory block includes a second source select line, a second drain select line, and a second word line group formed of a plurality of second word lines disposed between the second source select line and the second drain select line, and
wherein the second block word line is disposed so as to overlap the second word line group between the second source select line and the second drain select line.

4. The semiconductor memory device of claim 3, wherein the block word line further includes a third block word line for transferring the block selection signal for selecting the first memory block.

5. The semiconductor memory device of claim 4, further comprising:
a block decoder configured to output the block selection signal;
a first switching group configured to transfer first operation voltages to the first memory block in response to the block selection signal; and
a second switching group configured to transfer second operation voltages to the second memory block in response to the block selection signal,
wherein the first switching group is disposed between the block decoder and the first memory block, and wherein the first and second memory blocks are disposed between the first switching group and the second switching group.

6. The semiconductor memory device of claim 5, wherein the third block word line couples the block decoder and the first switching group without overlapping the first and second memory blocks.

7. The semiconductor memory device of claim 6, wherein the first and second block word lines couple the block decoder and the second switching group, wherein the first block word line passes through the first word line group to couple the block decoder and the second switching group, and wherein the second block word line passes through the second word line group to couple the block decoder and the second switching group.

8. The semiconductor memory device of claim 7, wherein each of the first and second block word lines is formed to be longer than the third block word line.

9. The semiconductor memory device of claim 7, further comprising:
a first global line decoder configured to output the first operation voltages; and
a first global line group configured to transfer the output first operation voltages to the first switching group,
wherein the first global line group is disposed between the block decoder and the first switching group.

10. The semiconductor memory device of claim 9, further comprising:
a second global line decoder configured to output the second operation voltages; and
a second global line group configured to transfer the output second operation voltages to the second switching group,
wherein the second switching group is disposed between the second global line group and the second memory block.

11. The semiconductor memory device of claim 4, further comprising one or more interlayer insulating layers configured to cover the first and second source select lines, the first and second drain select lines, and the first and second word line groups.

12. The semiconductor memory device of claim 11, wherein the first and second block word lines are formed on the same layer on the interlayer insulating layer.

13. The semiconductor memory device of claim 11, further comprising a common source line overlapping the first and second source select lines without overlapping the first and second word line groups and the first and second drain select lines,
wherein the common source line and the first and second block word lines are formed on the same layer on the interlayer insulating layer.

14. The semiconductor memory device of claim 11, further comprising ground lines overlapping the first and second word line groups,
wherein the ground lines and the first and second block word lines are formed on the same layer on the interlayer insulating layer.

15. The semiconductor memory device of claim 14, wherein each of the first and second block word lines is disposed between the ground lines.

16. A semiconductor memory device, comprising:
a memory array including a first memory block and a second memory block;
a first switching group configured to transfer first operation voltages to the first memory block in response to a block selection signal;
a second switching group facing the first switching group with the memory array interposed therebetween, and configured to transmit second operation voltages to the second memory block in response to the block selection signal; and
two or more block word lines overlapping the memory array, spaced apart from each other on the memory array, commonly connected to the second switching group, and configured to transfer the block selection signal to the second switching group.

17. The semiconductor memory device of claim 16, further comprising a first block word line connected to the first switching group, and configured to transfer the block selection signal to the first switching group.

18. The semiconductor memory device of claim 17, wherein the first block word line and the two or more block word lines are connected to one another outside a memory array region, in which the memory array is disposed.

19. The semiconductor memory device of claim 16, further comprising a block decoder disposed closer to the first switching group than the second switching group, and configured to output the block selection signal.

* * * * *